(12) United States Patent
Watanabe (10) Patent No.: US 11,264,243 B2
(45) Date of Patent: Mar. 1, 2022

(54) CONDUCTIVE DIFFUSER AND MANUFACTURING METHOD OF THE SAME

(71) Applicant: CoorsTek KK, Tokyo (JP)

(72) Inventor: Hiroki Watanabe, Hadano (JP)

(73) Assignee: COORSTEK KK, Tokyo (JP)

( * ) Notice: Subject to any disclaimer, the term of this patent is extended or adjusted under 35 U.S.C. 154(b) by 12 days.

(21) Appl. No.: 16/916,709

(22) Filed: Jun. 30, 2020

(65) Prior Publication Data
US 2021/0005458 A1 Jan. 7, 2021

(30) Foreign Application Priority Data

Jul. 2, 2019 (JP) .............................. JP2019-123711
Dec. 13, 2019 (JP) .............................. JP2019-224976
May 8, 2020 (JP) .............................. JP2020-082385

(51) Int. Cl.
*H01L 21/225* (2006.01)
*H01L 21/50* (2006.01)

(52) U.S. Cl.
CPC .......... *H01L 21/2257* (2013.01); *H01L 21/50* (2013.01)

(58) Field of Classification Search
CPC ................. H01L 21/2257; H01L 21/50; H01L 21/67017; H01L 21/67126; H01L 21/67201; H01L 21/67098
See application file for complete search history.

(56) References Cited

U.S. PATENT DOCUMENTS 10,974,183 B2 * 4/2021 Fukuoka ............. C04B 38/0041

FOREIGN PATENT DOCUMENTS

| JP | H0864582 A | 3/1996 |
| JP | H11181568 A | 7/1999 |
| JP | 2000256083 A | 9/2000 |
| JP | 5032937 B2 | 9/2012 |

OTHER PUBLICATIONS

Office Action dated Sep. 10, 2021, by the Korean Intellectual Property Office in corresponding Korean Patent Application No. 10-2020-0080159. (3 pages).

* cited by examiner

*Primary Examiner* — Quoc D Hoang (74) *Attorney, Agent, or Firm* — Buchanan, Ingersoll & Rooney PC (57) ABSTRACT

A diffuser includes a diffuser element made of silicon carbide having conductivity, conductive holding members for holding the diffuser element, conductive gaskets that seal between the diffuser element and the holding members. Static electricity on the diffuser element is eliminated through the gaskets, and the holding members.

6 Claims, 5 Drawing Sheets

CONDUCTIVE DIFFUSER AND MANUFACTURING METHOD OF THE SAME

TECHNICAL FIELD

This invention relates to a diffuser and to a manufacturing method of the same, for example, to a diffuser to be provided at a load lock chamber in a semiconductor manufacturing tool, a length measurement SEM, and a decompression processing apparatus to be used for liquid crystal substrates of a gas inlet (hereinafter simply processing apparatus), and to a manufacturing method of the above.

BACKGROUND OF ART

In semiconductor fabrication steps, the processing apparatus is depressurized and thermal treatment is carried out in a depressurized atmosphere. After completion of the thermal treatment, the pressure inside of the processing apparatus is turned to the atmospheric state from the depressurized state, and semiconductor wafers are taken out from the apparatus.

In such a semiconductor processing apparatus, a gas outlet and a gas inlet are provided usually to equate the atmosphere (pressure) in the processing apparatus to the atmosphere (pressure) of the outside thereof when the wafers to be processed are transferred into the apparatus from the outside or processed wafers are transferred to outside.

The processing apparatus is configured that the atmospheric gas in the apparatus is exhausted to a depressurized state through the gas outlet and the depressurized state is released by introducing gas through the gas inlet.

When the depressurized state is released by introducing the gas through the gas inlet, a diffuser is installed at the gas inlet to reduce pressure variation and to prevent particles in the apparatus from soaring up. The diffuse is also called a break filter.

Figure 6:
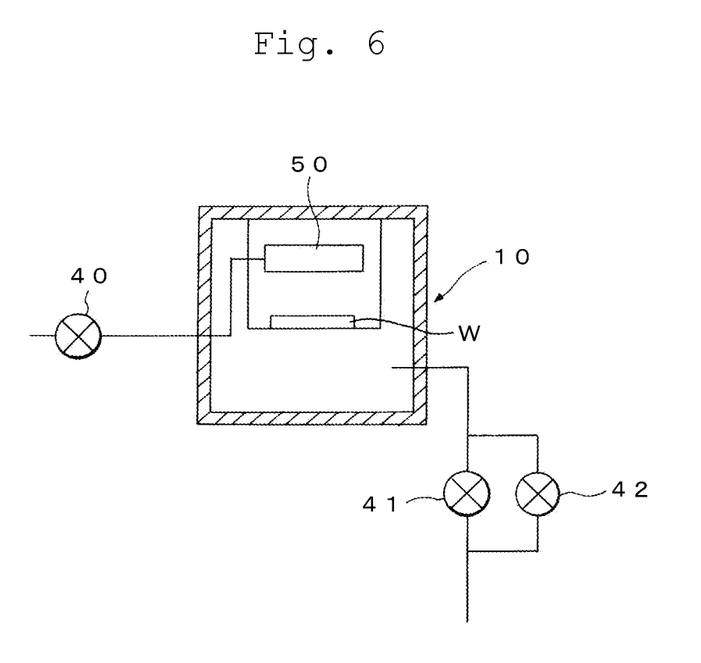
FIG. 6 illustrates an outline structure of a depressurizing device, or processing apparatus.
Figure 7:
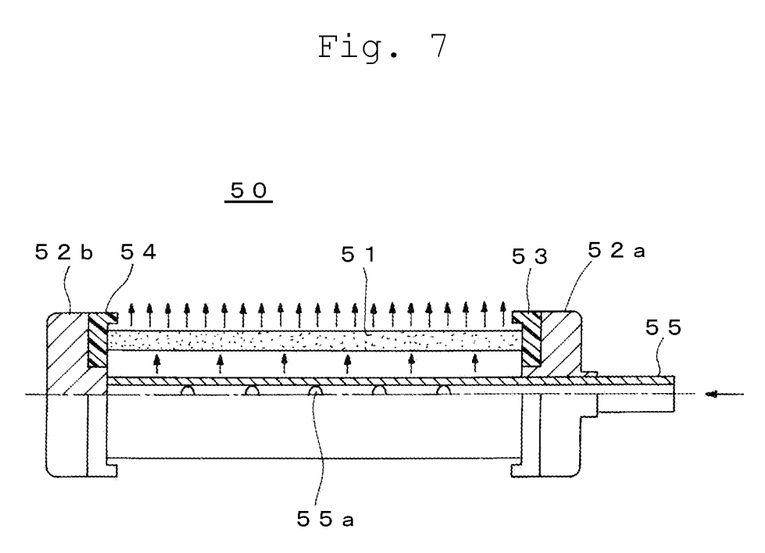
FIG. 7 is a partial cross-sectional view of an outline structure of a conventional diffuser.

A diffuser disclosed in the Japanese patent No. 5032937 is shown in FIG. 7 and described based on FIG. 7. Here, FIG. 6 shows an outline construction of a semiconductor processing apparatus described in U.S. Pat. No. 5,032,937.

As shown in FIG. 6, a diffuser 50 is provided in a semiconductor processing apparatus 10 to be used when the depressurized state is released by introducing a gas. Since the diffuser 50 is provided at the gas inlet, a pressure variation upon opening a closing valve 40 can be reduced and particles in the apparatus can be prevented from soaring up.

When evacuating the processing apparatus, since an adjusting valve 42 is provided in parallel to a closing valve 41 for evacuation, slow evacuation is achieved by operating the adjusting valve 42 when evacuation started. A numeral W denotes a wafer to be processed.

As shown in FIG. 7, in the diffuser 50, one end and the other end of a diffuser element 51 made of alumina are supported by a pair of metal holding members 52a and 52b through gaskets 53 and 54 both made of polytetrafluoroethylene (PTFE).

Further, in the diffuser element made of alumina, a pipe 55 for gas introduction is provided. The pipe 55 is a metal hollow-shaped, a cylinder, having a large number of through-holes 55a are bored on the circumferential wall and penetrates the holding members 52a and the diffuser element 51.

By opening the closing valve 40, a gas is introduced through the gas inlet pipe 55 at the holding members 52a and into the processing apparatus further through the through-holes 55a and the diffuser element 51 to release the depressurized state in the processing apparatus.

The flowing speed of the gas introduced into the processing apparatus is reduced by the diffuser element 51 functioning as a resistance to the gas flow, and this results to prevent particles from soaring up and dew occurrence in the processing apparatus.

The pair of the holding members and the gas inlet pipe is made of metal and have electric conductivity, but the diffuser element made of alumina is no-conductive and the gaskets are also non-conductive because they are made of PTFE.

Though diffusers made of metal material are for sale on the market, diffusers made of alumina having excellent corrosion resistance are preferred because there are opportunities where gas plasma or corrosive gases are used in the semiconductor processing apparatus.

However, when static electricity charges on the diffuser element due to some reasons, a technical problem arises that the static electricity causes particles floating in the air outside the processing apparatus or in the atmosphere inside the processing apparatus to adhere to the outer circumferential surface of the diffuser element.

When such a diffuser is used inside the processing apparatus, since particles are brought into the processing apparatus, or the particles inside the processing apparatus adhere to the diffuser, the particles soaring up increase inside the processing apparatus during use.

As a result, even if rapid changes in atmospheric pressure and the gas flow inside the processing apparatus are suppressed by the use of the diffuser, there arises a technical problem that soaring up of the particles increases, and deterioration of yield occurs.

SUMMARY OF INVENTION

To solve the above technical problem, the present inventor has completed through an intensive study a novel invention of construction of a diffuser that as an anti-static property with sufficient corrosion resistance.

The inventor has completed the invention through obtaining knowledge that it is possible to prevent the diffuser element from static charging and adhering particles, when a diffuser element is made of conductive ceramics and a gasket having conductivity is employed and a supporting part and a gas introducing pipe are made of conductive materials, such as metal.

It is an object to provide a diffuser capable of preventing adhering particles.

The diffuser to solve the above problem has a diffuser element made of silicon carbide having conductivity, a conductive supporting part to support the diffuser element, and a conductive gasket sealing the diffuser element and the holding member. The diffuser is characterized by that the electrostatic charges of the diffuser element are eliminated through the gasket and the holding member.

The diffuser according to the present invention not only shortens the gas introduction time to the processing apparatus, but also can alleviate a sudden change in pressure and gas flow rate, and has an excellent function of preventing particle adhesion, thus reducing the amount of particles in the processing apparatus.

More specifically, static charges on the diffuser element are released through the gasket and the holding member because the diffuser according to the present invention is composed of the ceramic diffuser element, holding member, and the gasket that are conductive.

That is, the diffuser according to the present invention is hardly charged and can prevent particles from adhering to the diffuser by static electricity.

The diffuser is provided with a cylindrical diffuser element, a first holding member which closes one end of the diffuser element, a second holding member closing the other end of the diffuser element and having a penetrating hole through which the gas inlet pipe is inserted, and a gas inlet pipe which passes through the inner area of the diffuser element, one end of which is fixed to the first holding member and on the circumferential side surface of which penetrating holes are provided. By attaching the second holding member to the grounded wall of the processing apparatus, the static charges on the diffuser element are desirably eliminated through the gasket and the holding member.

Thus, in the diffuser according to the present invention, static charging on the diffuser installed to the processing apparatus is prevented because the second holding member is attached to a wall of the processing apparatus which is grounded and the static charges on the diffuser element are eliminated through the gasket and the holding member.

As for the diffuser element, it is desirable to be formed of a sintered body of silicon carbide, for example. The sintered body of silicon carbide is adequate to the diffuser element functioning as a resister of gas flow because it has anti-corrosion, thermo-resistant, and chemical resistant properties, and further, it has a three-dimensional structure with appropriate porosity.

Besides, the sintered body of silicon carbide is conductive and hard to be charged; therefore, it is desirable for the material of the diffuser element of the diffuser.

The gasket is desirably made of a conductive material that is polytetrafluoroethylene with additives, and the holding member is desirably made of metal. Polytetrafluoroethylene (PTFE) has excellent chemical resistance and is easy to be highly purified, and is generally used in semiconductor industries. Polytetrafluoroethylene (PTFE) containing carbon black or carbon nanotubes, for example, are conductive and hard to be charged; thus, it is desirable for gasket material for the present invention.

The holding member made of metal has high-strength and is conductive and hard to be charged; therefore, it is desirable for holding member of the present invention.

In particular, the diffuser element is desirably made of the sintered silicon carbide having surface resistivity of $10^5$ Ω/sq or less, and the gasket is desirably made of conductive material of polytetrafluoroethylene with additives having surface resistivity of $10^5$ Ω/sq or less, and the holding member is desirably made of metal.

Since the surface resistivity of the diffuser element is $10^5$ Ω/sq or less, and the surface resistivity of the gasket is $10^5$ Ω/sq or less, charging is more properly prevented.

Note that with the installation of the diffuser on the processing apparatus, static charges on the diffuser element are eliminated through the gasket and the holding member.

In the diffuser described above, the gas inlet pipe penetrating the second holding member is connected with a fitting at the opposite side to the side where the diffuser element locates. The fitting includes an orifice that limits the gas flow into the fitting, and the flowing gas into the fitting through the orifice desirably passes via the penetrating holes provided on the gas inlet pipe and the passes through the diffuser element to the outside.

With the above-structured diffuser, because of the fact that the orifice controls the amount of the gas flow into the fitting, a gas flow variation due to the porosity variation or pore size variation of the diffuser element can be reduced. Namely, the diffuser can lessen the abrupt variation of pressure and gas flow even while reducing the releasing time of the chamber to the atmosphere, and the diffuser can reduce a gas flow variation due to the porosity variation or pore size variation of the diffuser element, as well. Consequently, a variation of the effectiveness of particle prevention is reduced and predetermined effectiveness of particle prevention can be obtained.

Further, each of the first holding member, the gas inlet pipe, and the fitting has a threaded portion. By screwing the gas inlet pipe with the first holding member and the fitting, or welding the gas inlet pipe to the backside of the second holding member, the first holding member, the diffuser element, the second holding member, and the fitting are desirably integrated.

A method of manufacturing the diffuser is characterized in that the amount of the gas flow of the diffuser element is measured in advance and the inner diameter of the orifice to be provided in the fitting is selected according to the measured values.

With the method of manufacturing the diffuser according to the present invention, diffusers, which achieve to reduce gas flowing variation due to the porosity variation or pore size variation of the diffuser element, can be easily obtained.

DESCRIPTION OF THE EMBODIMENTS

A diffuser according to the present invention will be described with reference to FIG. 1. Note that FIG. 1 is schematic, and the dimensions of respective parts or ratios may differ from the actual ones.

Figure 1:
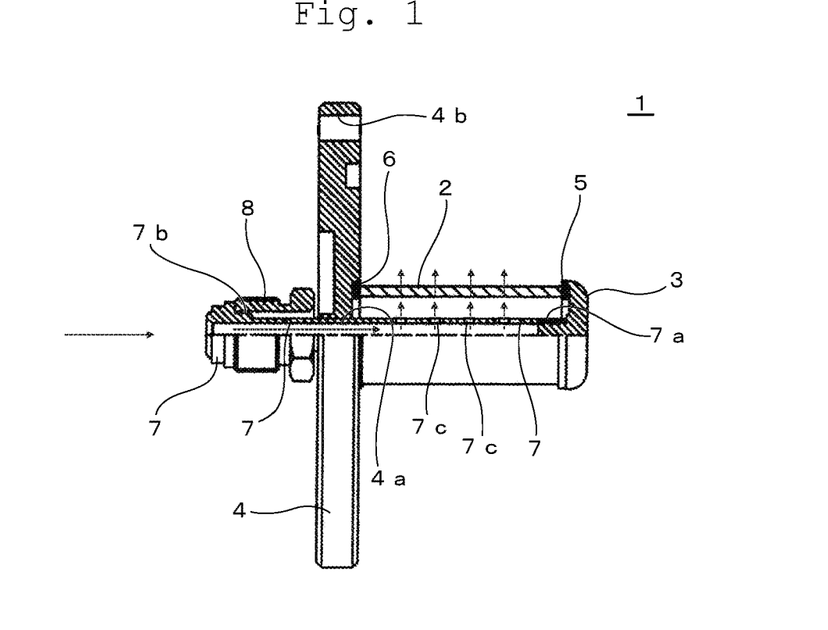
FIG. 1 is a partial cross-sectional view of an outline structure of a first embodiment of the diffuser according to the present invention.

As shown in FIG. 1, a diffuser 1 is provided with a diffuser element 2, first and second holding members 3, 4 that hold the diffuser element 2, and gaskets 5, 6 that seals the diffuser element 2 and the first and second holding members 3, 4, respectively.

A penetrating hole 4a is formed at the central part of the second holding member 4. Besides, a gas inlet pipe 7 through which gas is introduced into the diffuser element 2 is configured to penetrate the penetrating hole 4a of the second holding member 4 and further penetrate the inside of the diffuser element 2.

The gas inlet pipe 7 is made of metal and is hollow, and is provided with a large number of penetrating holes 7c on a circumferential side surface. The gas introduced in the gas inlet pipe 7 enters into the inside of the diffuser element 2 through the penetrating holes 7c. The gas passes through the diffuser element 2 that functions as a gas flow resistance element and enters the processing apparatus.

At a first end of the gas inlet pipe 7, a threaded portion 7a is formed and is threaded with the first holding member 3, and at a second end of the gas inlet pipe 7, a threaded portion 7b is formed that is configured to be screwed with a nut 8.

That is, the first end of the gas inlet pipe 7 is inserted into the nut 8 and the penetrating hole 4a of the holding member 4, further penetrated through the inside of the diffuser element 2, and is screwed with the first holding member 3 and fixed. The second end of the gas inlet pipe 7 is screwed with the nut 8 and fixed.

As described above, the diffuser element 2 is held by the first and second holding members 3, 4 through gaskets 5, 6, by bridging the gas inlet pipe 7 that is fixed to the first holding member 3 to the second holding member 4 and screwing the gas inlet pipe 7 with the nut 8.

Though the outer form of the diffuser element 2 is not particularly specified, when the diffuser element 2 has a cylindrical shape, for example, as shown in FIG. 1, the diffuser element 2 is held by the first holding member 3, being approximately disk-shaped with a small diameter, holding a first end of the diffuser element 2 and the second holding member 4, being approximately disk-shaped with a larger diameter, holding a second end of the diffuser element 2.

In this construction, the gaskets 5, 6 desirably have a ring shape with substantially the same diameter as the diffuser element 2, and each of the gaskets is inserted between the diffuser element 2 and the first and second holding members 5, 6.

A penetrating hole 4b to be used for installation to the processing apparatus is formed in the second holding member 4.

The reason why the second holding member 4 has a larger diameter compared with the first holding member 3 is that a stable installation state to the processing apparatus is made by enlarging the installing area for the processing apparatus and that further, static charges on the diffuser element 2 are certainly eliminated through the second holding member 4.

The first and second holding members 3, 4, and the gas inlet pipe 7 are made of stainless steel (SUS) with excellent corrosion resistance. Note that the material of the first and second holding members 3, 4, and the gas inlet pipe 7 is not limited to stainless steel, but metals such as nickel (Ni) or copper (Cu) may be used. The gas inlet pipe 7 and any one of the holding members 3, 4 may be integrally manufactured. The shape of the diffuser according to the present invention may have the shape shown in FIG. 7 mentioned as conventional technology or other shapes.

As for the material of the diffuser element 2, a sintered body of silicon carbide (SiC) is used, for example. The sintered body of silicon carbide has a three-dimensional network structure with an appropriate porosity and has conductivity, which is desirable. Silicon carbide material that the present inventor proposed in Japanese Patent Application JP-2018-046604 (Japanese Patent Publication 2019-156685) and U.S. Patent Application 2016/299555 (US 2019-0282941 A1) can be adopted.

Thus the sintered body of silicon carbide can function as a resistant body against gas flow due to a three-dimensional network structure with an appropriate porosity and can lessen the abrupt variation of pressure and gas flow even while reducing the releasing time of the chamber to the atmospheric pressure.

Since the sintered body of silicon carbide has electric conductivity, charging and adhesion of particles due to static electricity can be prevented.

As for the sintered body of silicon carbide, the porosity desirably ranges from 35.0% to 55.0%, and the average pore size desirably ranges from 3.0 μm to 9.0 μm. When the porosity is lower than 35.0% and the average pore size is smaller than 3.0 μm, it is not desirable because pressure loss increases, gas supply per unit time reduces and the releasing time of the chamber to the atmosphere largely elongated. When the porosity exceeds 55.0% and the average pore size exceeds 9.0 μm, it is not desirable because performance of preventing particles from soaring up degrades.

The mercury penetration method can be employed for the measurement of the average pore size, and a scanning electron microscope (SEM) image analysis method can be employed for the measurement of the average particle size of the silicon carbide.

The diffuser element 2 described above can be prepared by adding organic binders to the silicon carbide raw material with the average pore size ranging from 0.5 μm to 5.0 μm, mixing and forming the material, and then sintering the formed material in a non-oxidizing atmosphere.

Sintering may be performed at a temperature of not less than 2200° C. and not more than 2400° C. for 2 hours, for example. The reason why the average particle diameter of the raw material of silicon carbide is 0.5 μm or more and 5 μm or less is that when it is less than 0.5 μm, the porosity the becomes low, the gas supply amount per unit time reduces, and the time to reach the atmospheric pressure is significantly elongated. If it exceeds 5 μm, the pore size becomes large, and the particle collection performance and the function of alleviating a rapid change in the gas flow deteriorate.

The sintered body of silicon carbide can be obtained at a temperature lower than 2200° C., but this causes insufficient particle growth and residuals of fine powder of silicon carbide to be a source of particles, and further, it causes to reduce the pore size and to elongate the releasing time to the atmospheric pressure significantly. In addition, the particle growth becomes insufficient and strength is not sufficient.

On the other hand, when the sintering temperature is higher than 2400° C., particle growth progresses to enlarge the pore size, and this causes to deteriorate the performance of particle collection and lessen the function of alleviating rapid change of gas flow.

When the sintering temperature ranges from 2200° C. to 2400° C., fine powder of silicon carbide vaporizes or aggregates, and sources of particles are lessened and the strength becomes sufficient.

The raw particles of silicon carbide are a mixture of fine particles of silicon carbide with an average diameter smaller than 1 μm and fine particles of silicon carbide with an average diameter of 1 μm or more. The ratio of the fine particles of silicon carbide with an average diameter smaller than 1 μm desirably falls in a range between 10 wt. % and 20 wt. % of the whole silicon carbide particles.

With thus prepared raw particles of silicon carbide in a range of the average particle diameter of 0.5 μm or more and 5 μm or less, the size ratio to the whole particles is appropriately managed and targeted pores and skeletal structure are subject to be formed.

As for the conductivity of the diffuser element, the surface resistivity is desirably $10^5$ Ω/sq or less. This value of the surface resistivity can be achieved by selecting silicon carbide itself having the desired characteristics and removing the insulating layer formed on the surface of silicon carbide particles, after sintering at a high temperature near 2300° C. and recrystallization. When the surface resistivity exceeds $10^5$ Ω/sq, it is not desirable that the diffuser is subject to be charged and particles are likely to adhere to the diffuser.

The material of the gaskets 5, 6 are desirably polytetrafluoroethylene (PTFE), because PTFE, generally employed in semiconductor industries, has excellent anti-chemical resistance and anti-contamination property and conductive PTFE has electric conductivity. The conductive PTFE can be obtained by adding carbon black or carbon nanotubes to PTFE. Charging to the diffuser element is suppressed due to conductive gaskets 5, 6. Charging to the diffuser element causes adhesion of particles. The use of conductive gaskets 5, 6 can suppress particle adhesion to the diffuser element 2.

The surface resistivity of the gaskets is desirably $10^5$ Ω/sq or less. The value of the surface resistivity can be adjusted by varying the amount of carbon black or carbon nanotubes.

When the value of the surface resistivity exceeds $10^5$ Ω/sq, it is not desirable that the diffuser element 2 is subjected to be charged and particles subject to adhere.

Figure 2:
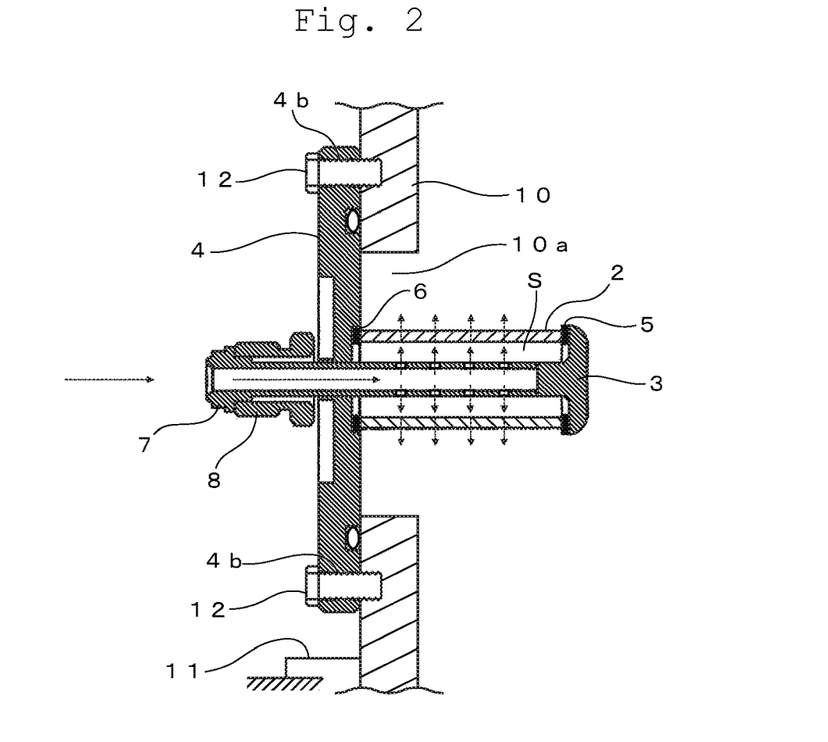
FIG. 2 is a cross-sectional view showing a state in which the diffuser of FIG. 1 is attached to a processing apparatus.

FIG. 2 shows the diffuser 1 shown in FIG. 1 installed to the processing apparatus. The processing apparatus 10 is the one to be provided at, for example, a load lock chamber, a length measurement SEM, and a decompression processing apparatus to be used for liquid crystal substrates, and the diffuser 1 is installed at a gas inlet port 10a with a fastening method 12 such as screws. In this situation, static charges on the diffuser element 2 are eliminated through the gaskets and holding members by attaching the second holding member 4 of the diffuser 1 to the wall of the processing apparatus 10 that is grounded with a grounding wire 11.

Charging on the diffuser 1 is prevented and particle adhesion is suppressed because the diffuser 1 attached to the grounded processing apparatus 10 is always kept in a state where the static charges are to be eliminated.

As described above, since the diffuser 1 according to the present invention is provided with a conductive diffuser element 2, first and second holding members 3, 4 that hold the diffuser element 2, conductive gaskets 5, 6 that seal between the diffuser element 2 and the first and second holding members 3, 4, then, charging on the diffuser 1 is prevented and particle adhesion is suppressed.

Gas is introduced into the inside space S of the diffuser element 2 through the penetrating hole 7c of the gas inlet pipe 7, then introduced into the processing apparatus through the diffuser element as a resistant body against the gas flow.

As a result, the depressurized chamber can be released to the atmospheric pressure with preventing the abrupt variation of pressure and gas flow in the processing apparatus and soaring up of particles can be prevented.

A diffuser according to the second embodiment according to the present invention will be described based on FIG. 3 and FIG. 4. Positions and members that correspond to the positions and members according to the first embodiment will be designated by the same reference numerals, and the detailed description will be omitted.

Figure 3:
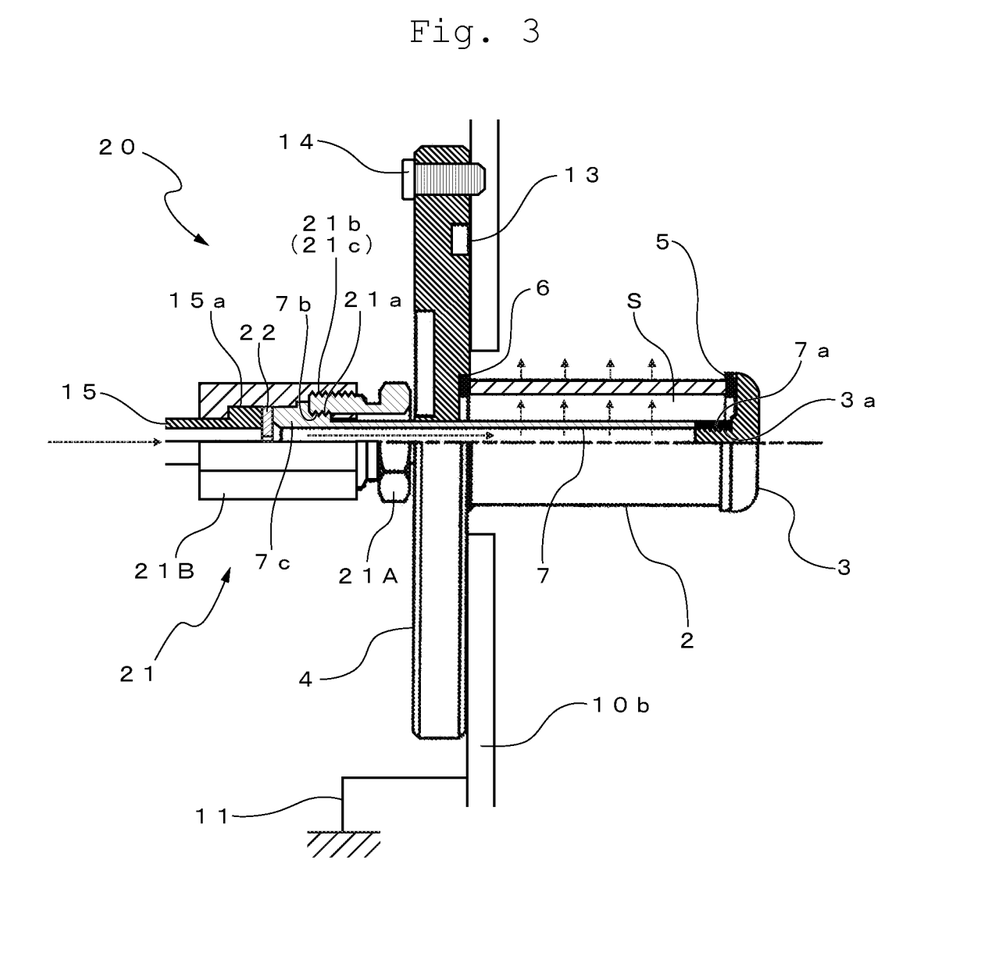
FIG. 3 is a partial cross-sectional view of an outline structure of a second embodiment of the diffuser according to the present invention.

The diffuser 20, as shown in FIG. 3, is provided with a diffuser element 2, a first holding member 3, gas inlet pipe 7, a second holding member 4, a fitting 21, and an orifice 22.

Gaskets 5, 6 are inserted between the diffuser element 2 and the first holding member 3, and between the diffuser element 2 and the second holding member 4, respectively.

Though the outer shape of the diffuser 20 is not particularly limited, such a configuration is desirable where the diffuser element 2, as shown in FIG. 3, is cylindrical, and is held by a first holding member 3 and the second holding member 4, both being approximately disk-shaped. In the configuration, gaskets 5, 6 are ring-shaped having the approximately same diameter as the diffuser element 2.

The first holding member 3 seals one end of the diffuser element 2, as shown in FIG. 3. The gas inlet pipe 7 is configured to extend in the direction of the other end of the diffuser element 2 through the inside of the diffuser element 2 from the center of the first holding member 3.

The second holding member 4 is disposed to fix the other end of the diffuser element 2. The fitting 21 fixes the gas inlet pipe 7 penetrating the second holding member 4 from the backside of the second holding member 4, which is the opposite side to the side where the diffuser element locates.

The second holding member 4 is fixed to the wall 10b of the processing apparatus 10 with screws 14 through an O-ring 13.

The first holding member 3, the gas inlet pipe 7, the second holding member 4, and the fitting 21 are made of metal. For example, stainless steel, nickel, or copper can be used for the first holding member 3, the gas inlet pipe 7, the second holding member 4 and the fitting 21.

A thread portion 3a is formed on the first holding member 3, and a thread portion 7a is formed on one end of the gas inlet pipe 7, and both are configured to be screwed together. Further, a thread portion 7b is formed on the other end of the gas inlet pipe 7 and is configured to be screwed with the fitting 21.

The fitting 21 is composed of a male nut 21A and a female nut 21B, and, as described above, a thread portion 21a which is screwed with the thread portion 7b of the gas inlet pipe 7 is formed on the inner circumferential side surface of the male nut 21A. A thread portion 21b, which is screwed with the thread portion 21c of the female nut 21B, is formed on the outer circumferential side surface of the male nut 21A.

Therefore, the second holding member 4 and the diffuser element 2 are fixed to be held between the first holding member 3 and the fitting 21, by screwing the thread portion 7a of the gas inlet pipe 7 with the thread portion 3a of the first holding member 3 and screwing the thread portion 7b of the gas inlet pipe 7 with the thread portion 21a of the fitting 21.

Further, the orifice 22 is mounted in the fitting 21 by interposing the orifice 22 between the tip end face of a gas introducing pipe 15 and the tip end face of the gas inlet pipe 7 and then screwing the thread portion 21c of the female nut 21B with the thread portion 21b on the outer circumferential side surface of the male nut 21A.

By this procedure, the diffuser element 2, the first holding member 3, the gas inlet pipe 7, the second holding member 4, and the fitting 21 are integrated. Gas tightness is desirably increased by using a gasket or a washer, not shown, between the male nut 21A and the second holding member 4.

Figure 5:
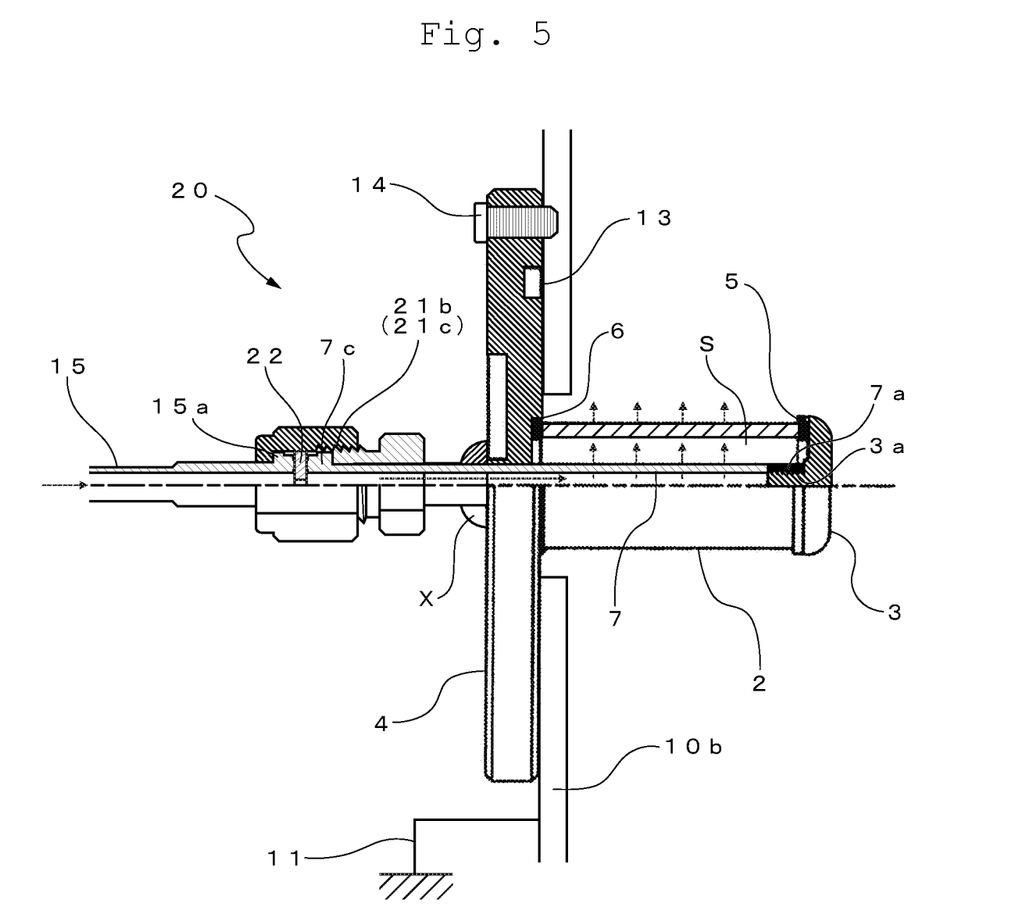
FIG. 5 is a partial cross-sectional view of an outline structure of a third embodiment of the diffuser according to the present invention.

Fastening of the first holding member 3, the second holding member 4, the diffuser element 2, and the fitting 21 is achieved not necessarily by the use of a thread structure, but the gas inlet pipe 7 may be attached to the second holding member 4 by welding, which forms a welded portion X, as shown in FIG. 5 of the third embodiment.

As shown in FIG. 5, a protruding portion 15a in the radial direction at a tip end of the gas introducing pipe 15 is formed and a protruding portion 7c in the radial direction at a tip end of the gas inlet pipe 7 is formed. An orifice 22 is interposed between the tip end of the gas introducing pipe 15 and the tip end of the gas inlet pipe 7. The thread portion 21c of the female nut 21B is screwed with the thread portion 21b on the outer circumferential side surface of the male nut 21A, and the orifice 22 may be engaged in the fitting 21 by pressing the protruding portion 7c with the tip end of the male nut 21A and by pressing the protruding portion 15a with the tip end of the female nut 21B.

In FIG. 5, the same members as those shown in FIGS. 1 and 3 are designated by the same reference numerals, and detailed description thereof will be omitted.

As described above, the diffuser 20 is provided with the orifice 22. As shown in FIG. 4, the orifice 22 is a plate member arranged to traverse the inner diameter of the fitting 21 and has an opening 22a at part of the plate member. The orifice 22 plays a role of limiting the gas flow flowing into the fitting 21.

The orifice 22 is desirably made of materials such as stainless steel or nickel.

Figure 4:
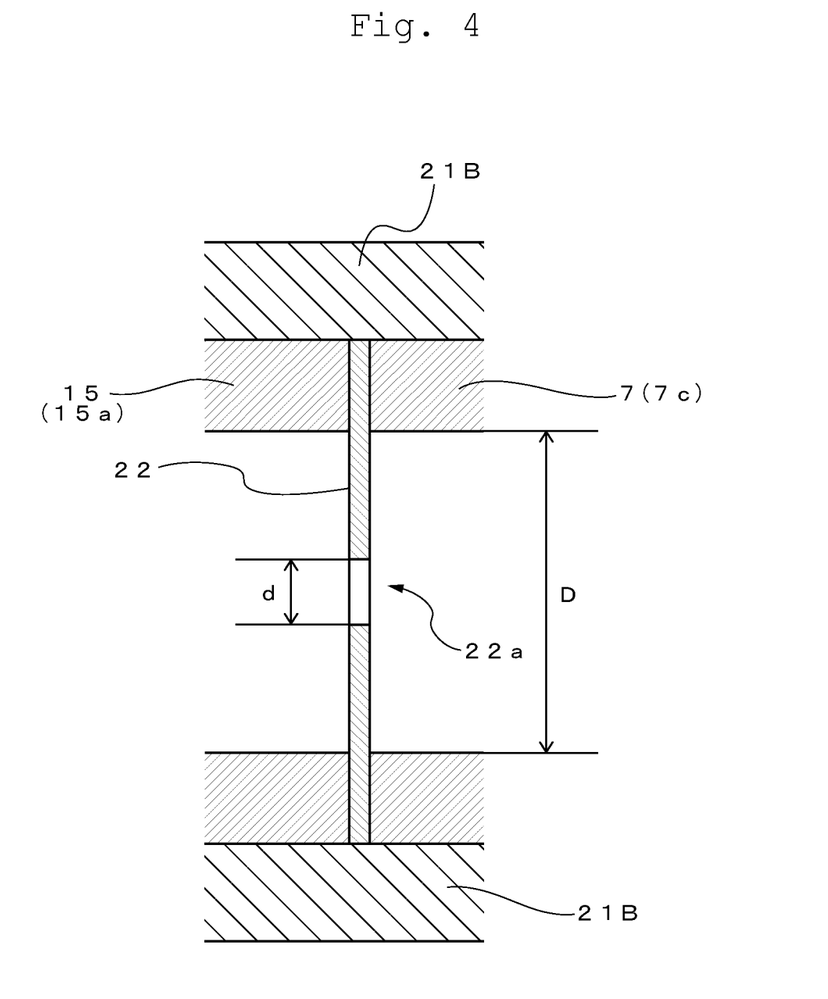
FIG. 4 is an enlarged sectional view of the orifice of FIG. 3.

The orifice 22 shown in FIG. 4 works also as a gasket when the fitting 21 is connected to the gas introducing pipe 15.

Thus the orifice 22 having the same function as the gasket is called an orifice gasket. Attention should be drawn to the difference between the orifice and a conventional gasket.

The function of the gasket is to increase hermeticity when the fitting 21 is connected to the gas introducing pipe 15. Though a gasket is also a plate member to traverse the inner diameter of the fitting 21 and has an opening at part of the plate member, the diameter of the opening is substantially the same as the inner diameter at the tip end of the gas introducing pipe 15 and the gas inlet pipe 7. Namely, the relationship between the diameter d of the opening of the gasket and the inner diameter D at the tip end of both the gas introducing pipe 15 and the gas inlet pipe 7 is given by d=D.

On the other hand, because the orifice plays the role to limit the gas flow into the fitting 21, the diameter d of the opening 22a of the orifice 22 is smaller than the inner diameter D at the tip end of the gas introducing pipe and the gas inlet pipe 7. Namely, the relationship between the diameter d of the opening 22a of the orifice 22 and the inner diameter D at the tip end of the gas introducing pipe 15 and the gas inlet pipe 7 is given by d<D.

As described above, even in the case when an orifice gasket is used, if the relationship between the diameter d of the opening 22a of the orifice 22 and the inner diameter D at the tip end of the gas introducing pipe 15 and the gas inlet pipe 7 is given by d<D, it is considered that the orifice 22 is used for limiting the gas flow into the fitting 21.

Note that the diffuser 20 according to the present invention may use an independent orifice 22, not the orifice gasket having common functions of an orifice and a gasket shown in FIG. 4.

Example 1

First, prepare silicon carbide with an average particle diameter of 0.7 μm. To 100 weight parts of the silicon carbide, add 1 weight part of polyvinyl alcohol (PVA) as a binder and mixed with water. Then after, the mixture is dried and pulverized and formed into a cylindrical shape by cold isostatic pressing (CIP) molding. The molding is sintered at 2300° C. for 2 hours. The obtained sintered body is machined to a shape having an outer diameter of 19 mm, an inner diameter of 15 mm, and a length of 37 mm, and a diffuser element is formed. The surface resistivity of the diffuser element 11 is shown in Table 1.

The surface resistivity is measured by clamping an object to be measured by two electrodes using a RESISTANCE METER RM3548 manufactured by HIOKI E.E. CORPORATION. For the measurement of the diffuser element, copper foils are contacted on both end portions and the electrodes are respectively connected with the copper foils.

A conductive PTFE material manufactured by MC YAMASAN POLYMERS CO., LTD. is used for the gasket. The conductive PTFE material is processed to a shape with an outer diameter of 20.6 mm, an inner diameter of 14 mm, and a thickness of 1.5 mm and used. The surface resistivity of the gasket is shown in Table 1. The surface resistivity of a gas inlet device (diffuser) 10 is also shown in Table 1.

Measurement of the surface resistivity of the gasket is performed using the above-described equipment by clamping with electrodes two distant positions of a ring-shaped gasket.

Measurement of the surface resistivity of the diffuser is performed using the above-described equipment by respectively clamping with electrodes the surface of the diffuser element and the gas inlet pipe.

Comparative Example 1

As a comparative example 1, a raw material used for the diffuser was alumina supplied by Pall Corporation formed into a cylindrical shape. Physical dimensions were an outer diameter of 19 mm, an inner diameter of 15 mm, and a length of 37 mm, which are the same as Example 1. The obtained surface resistivity of the diffuser element of the comparative example 1 is shown in Table 1.

PTFE supplied by World Clean Tech, Co., Ltd. was processed to a gasket with an outer diameter of 20.6 mm, an inner diameter of 14 mm, and used. The surface resistivity of the gasket of the comparative example 1 is shown in Table 1, and the surface resistivity of the diffuser is also shown in Table 1.

TABLE 1

| Resistivity (Ω/sq) | Diffuser | Diffuser element | Gasket |
|---|---|---|---|
| Example 1 | $4.93 \times 10^3$ | $5.95 \times 10^3$ | $9.86 \times 10^3$ |
| Comparative example 1 | $>10^{18}$ | $>10^{14}$ | $>10^{18}$ |

As seen from the above, for Example 1, the resistivity of the diffuser element 2 is $10^5$ Ω/sq or less, the resistivity of the gasket is $10^5$ Ω/sq or less, and the resistivity of the diffuser 1 is also $10^5$ Ω/sq or less.

Examples 2 to 11, and Comparative Examples 2 to 11

The verification of the effects of the diffuser in the second embodiment according to the present invention described above will be explained.

A sintered body of silicon carbide to be used in the diffuser 2 for the verification of effects was prepared as follows.

First, silicon carbide with an average particle diameter of 0.7 μm is prepared. To 100 weight parts of the silicon carbide, 1 (one) weight part of polyvinyl alcohol (PVA) as a binder is added and mixed with water.

Then after, the mixture is dried and pulverized and formed into a cylindrical shape by cold isostatic pressing (CIP) molding. The molding is sintered at 2300° C. for 2 hours. The obtained sintered body is machined to a shape having an outer diameter of 19 mm, an inner diameter of 15 mm, and a length of 37 mm, and a diffuser element is formed.

A diffuser shown in FIG. 3 was formed using the above-obtained diffuser element. An orifice to limit the gas flow into the fitting is provided in the fitting.

The orifice used for verification of the effects of a break filter according to the present invention was the one with the diameter d of an opening ranges from 2.8 mm to 5.5 mm, and the inner diameter D of the tip end of the gas introducing pipe 15 and of the gas inlet pipe 7 was 5.5 mm.

On the other hand, in the comparative examples, only one type of orifice with an inner diameter of 5.5 mm was used without varying the diameter of the opening in a similar diffuser.

In thus-constructed Examples 2 to 11 and comparative examples 2 to 11, the amount of gas passing per minute through the diffuser was measured.

The gas flow per minute passing through the diffuser element is measured under the experimental condition that gas of the standard pressure of 0.1 MPa, corresponding to releasing to the atmospheric pressure, is introduced to a fitting.

TABLE 2

| | Diameter of orifice (mm) | Gas flow (@0.1 Mpa) (L/min) | Standard Deviation | Coefficient of Variation |
|---|---|---|---|---|
| Example 2 | 3.2 | 37 | 0.70 | 0.019 |
| Example 3 | 3.4 | 36 | | |
| Example 4 | 3.2 | 36 | | |
| Example 5 | 5.5 | 35 | | |
| Example 6 | 3.0 | 36 | | |
| Example 7 | 2.8 | 35 | | |
| Example 8 | 3.4 | 36 | | |
| Example 9 | 3.2 | 36 | | |
| Example 10 | 3.0 | 37 | | |
| Example 11 | 5.5 | 35 | | |
| Comparative example 2 | 5.5 | 45 | 4.50 | 0.107 |
| Comparative example 3 | 5.5 | 39 | | |
| Comparative example 4 | 5.5 | 43 | | |
| Comparative example 5 | 5.5 | 35 | | |
| Comparative example 6 | 5.5 | 46 | | |
| Comparative example 7 | 5.5 | 49 | | |
| Comparative example 8 | 5.5 | 39 | | |
| Comparative example 9 | 5.5 | 42 | | |
| Comparative example 10 | 5.5 | 47 | | |
| Comparative example 11 | 5.5 | 36 | | |

As understood from the results of verification, variation in gas flow falls in a range from 35 L/min to 37 L/min in Examples 2 to 11. In terms of statistical indices, the standard deviation is 0.70, and the coefficient of variation is 0.019.

In contrast to this, the variation of gas flow scatters from 36 L/min to 49 L/min for the comparative examples 2 to 11, where an orifice is used having an inner diameter d same as the inner diameters D of the tip end of the gas introducing pipe 15 and the gas inlet pipe 7. In terms of statistical indices, the standard deviation is 4.50, and the coefficient of variation is 0.107.

As described above, the diffuser according to the present invention can suppress particles adhering on the diffuser and particles brought into the processing apparatus, because of the improved function of suppression of particle adhesion.

Note that a cylindrical-shaped diffuser element is employed in the description of the above embodiment, but the shape of the diffuser element may be disk-shaped, for example.

Further, the diffuser according to the present invention can reduce the variation of gas flow due to individual differences of the pore in the diffuser element. Considering the results of the verification above, when the diffuser is manufactured, the amount of the gas flow through the filter element is measured in advance, and then the inner diameter of the orifice placed in the fitting is desirably determined according to the measurement results.

The present invention is described based on the embodiments, but the scope of the invention is not limited thereby.

EXPLANATION OF THE REFERENTIAL NUMERALS

1 Diffuser
2 Diffuser element
3 First holding member
4 Second holding member
5 Gasket
6 Gasket
7 Gas inlet pipe
8 Nut
10 Processing apparatus
10a Gas inlet
11 Grounding wire
15 Gas introducing pipe
20 Diffuser
21 Fitting
21A Male nut
21B Female nut
22 Orifice

What is claimed is:

1. A conductive diffuser, comprising:
a diffuser element comprising conductive silicon carbide;
a conductive holding member holding the diffuser element; and
a conductive gasket sealing between the diffuser element and the holding member,
wherein the diffuser element is in contact with the gasket, the gasket is disposed in contact with the holding member, the diffuser element is held by the holding member through the gasket.

2. The conductive diffuser according to claim 1, comprising:
a cylinder-shaped diffuser element;
a first holding member closing one end of the diffuser element;
a second holding member closing the other end of the diffuser element and having a penetrating hole; and
a gas inlet pipe, inserted through the second holding member and the inside of the diffuser element, and fixed to the first holding member at one end thereof, having a penetrating hole on the outer circumferential side surface, wherein the static electricity on the diffuser element is eliminated through the gasket and the holding members by attaching the second holding member to a grounded wall of a processing apparatus.

3. The conductive diffuser according to claim 2, wherein the diffuser element is formed of a sintered body of silicon carbide and configured to have surface resistivity of 105 Ω/sq or less, the gasket is formed of a conductive material comprising polytetrafluoroethylene with an additive and configured to have surface resistivity of 105 Ω/sq or less, and the holding members are formed of metal.

4. The conductive diffuser according to claim 2, wherein the gas inlet pipe penetrating the second holding member is connected to a fitting at an opposite side to a side where the diffuser element is located, the fitting includes an orifice that limits a gas flow flowing into the fitting, and the flowing gas into the fitting through the orifice passes via the penetrating hole provided on the gas inlet pipe and permeates through the diffuser element to the outside.

5. The conductive diffuser according to claim 4, wherein each of the first holding member, the gas inlet pipe and the fitting includes a threaded portion, and wherein the first holding member, the diffuser element, the second holding member, and the fitting are integrated by screwing the gas inlet pipe with the first holding member and the fitting, or by welding the gas inlet pipe to the backside of the second holding member.

6. A method of manufacturing the conductive diffuser recited in claim 4, wherein an amount of the gas flow per unit time through the diffuser element is measured in advance and the inner diameter of the orifice to be provided in the fitting is selected according to measured values.

* * * * *